United States Patent
Honkura et al.

(10) Patent No.: US 7,224,161 B2
(45) Date of Patent: *May 29, 2007

(54) MAGNET WITH ELECTROMAGNETIC COIL/IMPEDANCE/SENSOR ELEMENT

(75) Inventors: Yoshinobu Honkura, Tokai (JP); Michiharu Yamamoto, Tokai (JP); Masaki Mori, Tokai (JP); Yoshiaki Koutani, Tokai (JP)

(73) Assignee: Aichi Steel Corporation, Tokai-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/501,329

(22) PCT Filed: Feb. 19, 2003

(86) PCT No.: PCT/JP03/01749

§ 371 (c)(1),
(2), (4) Date: Feb. 2, 2005

(87) PCT Pub. No.: WO03/071299

PCT Pub. Date: Aug. 28, 2003

(65) Prior Publication Data

US 2005/0116708 A1   Jun. 2, 2005

(30) Foreign Application Priority Data

Feb. 19, 2002   (JP)   ............... 2002-042325

(51) Int. Cl.
*G01R 33/02*   (2006.01)

(52) U.S. Cl. ........ 324/249; 324/247; 324/253
(58) Field of Classification Search ........... 324/249, 324/247, 253
See application file for complete search history.

(56) References Cited

U.S. PATENT DOCUMENTS 6,831,457 B2 * 12/2004 Honkura et al. ............ 324/249

FOREIGN PATENT DOCUMENTS

| JP | 2001-133530 | 5/2001 |
| JP | 2001-318131 | 11/2001 |

* cited by examiner

*Primary Examiner*—Reena Aurora
(74) *Attorney, Agent, or Firm*—Oblon, Spivak, McClelland, Maier & Neustadt, P.C.

(57) ABSTRACT

A magneto impedance sensor element with electromagnetic coil comprised of: a terminal board on which an extended groove which extends in one direction has been formed; an electromagnetic coil, made with one part of the coil formed in a spiral shape inside the extended groove in the terminal board, and joined to each tip of that coil the other part of the coil placed across the top of the groove; insulating material placed in the extended groove on the terminal board; and a magnetic sensitive body inserted within the insulating material, to which either high frequency or pulse electic current is applied. When either high frequency or pulse electrical current is applied to the magnetic sensitive body, voltage is output from the above electromagnetic coil in response to the intensity of the external magnetic field which is generated in the electromagnetic coil.

9 Claims, 7 Drawing Sheets

MAGNET WITH ELECTROMAGNETIC COIL/IMPEDANCE/SENSOR ELEMENT

TECHNICAL FIELD OF THE INVENTION

The present invention pertains to the miniaturization, high sensitivity, and wide range of a magneto impedance sensor element (hereinafter referred to as MI element) which is a magnetic sensor and incorporates an electromagnetic coil. The automotive industry is one concrete example of its possible application.

BACKGROUND OF THE INVENTION

FIG. 13, (Japanese Patent Laid-open No. 2000-81471, 2001-296127) shows the construction of a conventional MI element.

In the central part of the MI element is a magnetic sensitive body made from amorphous metal wire. The magnetic sensitive body is set on a terminal board, around which an electromagnetic coil is wound. The conventional MI element uses an electromagnetic coil ranging in diameter from 1 to 5 mm, and the usual size of an MI element is width 3 mm, height 2 mm, length 4 mm.

The above mentioned conventional MI element was able to achieve some degree of high sensitivity, miniaturization, and low power consumption when applied as a magnetic sensor. However, inadequate miniaturization in high performance magnetic sensors was a problem.

In the present field, further miniaturization of high efficiency magnetic sensors (hereafter MI sensor) using this MI element has presently become necessary. However, because conventional MI elements were constructed with an electromagnetic coil wound external to the terminal board, the size of MI elements was necessarily large. Therefore, further miniaturization of MI elements was sought.

INVENTION DISCLOSURE

Consequently the inventor, as a result of thoroughly investigating the miniaturization of MI elements, focused on the technological concepts behind the present invention. On a terminal board an extended groove has been formed in one direction. Inside this extended groove one part of a coil has been formed, and joined to each tip of that coil the other part of the coil is placed across the top of the groove, so that together the two parts form a complete spiral. This complete electromagnetic coil forms a magnetic sensitive body, which is placed into the extended groove on the above terminal board and surrounded with insulating resin. When either high frequency or pulse electrical current is transmitted to the magnetic sensitive body, voltage is output from the above electromagnetic coil according to the intensity of the external magnetic field which is generated in the coil.

On the basis of the technological concepts of this invention which were the inventor's focus, and furthermore as a result of accumulated research and development, the inventor arrived at the present invention.

The purpose of this invention is to achieve smaller form and volume, lower power consumption, higher sensitivity, and wider range in an MI element.

The first aspect of the present invention is that a magneto impedance sensor element with electromagnetic coil of the present invention comprises a terminal board on which an extended groove has been formed in one direction. Inside this extended groove one part of a coil has been formed, and joined to each tip of that coil the other part of the coil is placed across the top of the groove, so that together the two parts form a complete spiral. This complete electromagnetic coil forms a magnetic sensitive body, which is inserted into the extended groove on the above terminal board and surrounded with insulating resin. When either high frequency or pulse electrical current is applied to the magnetic sensitive body, voltage is output from the above electromagnetic coil in response to the intensity of the external magnetic field generated in the electromagnetic coil.

The second aspect of the present invention is that the magneto impedance sensor element with electromagnetic coil uses conductive magnetic amorphous metal wire to create the magnetic sensitive body in the first aspect of the invention.

The third aspect of the present invention is that the inner coil diameter of the electromagnetic coil mentioned in the second aspect of the invention is not more than 200 micrometers.

The fourth aspect of the present invention is that the electromagnetic coil mentioned in the third aspect of the invention has a line spacing separation per turn of not more than 100 micrometers.

The fifth aspect of the present invention is that the length of the magnetic sensitive body mentioned in the second aspect of the invention is set at not more than 3 mm.

The sixth aspect of the present invention is that the ratio of wire diameter to wire length used in the magnetic sensitive body mentioned in the second aspect of the invention is set at an aspect ratio from 10 to 100.

The seventh aspect of the present invention is that the inner coil diameter of the electromaganetic coil mentioned in the sixth aspect of the invention is set from 1.005 to 10 times the wire diameter of the magnetic sensitive body.

The eighth aspect of the present invention is that the inner coil diameter of the electromagnetic coil mentioned in aspect 2 of the invention is not more than 100 micrometers.

The ninth aspect of the present invention is that the electromagnetic coil mentioned in the third aspect of the invention has a line spacing separation per turn of not more than 50 micrometers.

In the magneto impedance sensor element with electromagnetic coil, comprised as described above in the first aspect of the invention, a smaller, thinner shape and lower power consumption is made possible. A groove has been extended in one direction on a terminal board. Inside this extended groove one part of a coil has been formed spirally, and joined to each tip of that coil the other part of the coil is placed across the top of the groove, so that together the two parts form a complete spiral. This complete electromagnetic coil forms a magnetic sensitive body, which is inserted into the extended groove on the above terminal board and surrounded with insulating resin. When either high frequency or pulse electrical current is applied to the magnetic sensitive body, voltage is output from the above electromagnetic coil in response to the intensity of the external magnetic field which is generated in the electromagnetic coil. Due to this construction, further miniaturization and a reduction in required power is realized.

In the magneto impedance sensor element with electromagnetic coil, comprised as described above in the second aspect of the invention, the magnetic sensitive body mentioned in the first aspect of the invention is made from conductive magnetic amorphous metal wire. Due to this construction, higher sensitivity is realized.

In the magneto impedance sensor element with electromagnetic coil, comprised as described above in the third aspect of the invention, the electromagnetic coil mentioned in the second aspect of the invention has an inner coil diameter of not more than 200 micrometers. Due to this construction, a smaller, thinner shape is realized.

In the magneto impedance sensor element with electromagnetic coil, comprised as described above in the fourth aspect of the invention, the electromagnetic coil mentioned in the third aspect of the invention has a line spacing separation per turn of not more than 100 micrometers. Due to this construction, a high density electromagnetic coil is realized, thereby also realizing higher sensitivity.

In the magneto impedance sensor element with electromagnetic coil, comprised as described above in the fifth aspect of the invention, the length of the magnetic sensitive body in the second aspect of the invention is set at not more than 3 mm. Due to this construction, miniaturization is realized.

In the magneto impedance sensor element with electromagnetic coil, comprised as described above in the sixth aspect of the invention, the proportion of wire diameter to length of the magnetic sensitive body in aspect two of the invention is set at an aspect ratio from 10 to 150. Due to this construction, linearity is preserved and the range of the measurable magnetic field is increased, thereby realizing a wider range. The automotive field is one concrete example of possible application.

In the magneto impedance sensor element with electromagnetic coil, comprised as described above in the seventh aspect of the invention, the inner coil diameter of the electromagnetic coil mentioned in the sixth aspect of the invention is set from 1.005 to 10 times the wire diameter of the magnetic sensitive body. Due to this construction, higher sensitivity is realized.

In the magneto impedance sensor element with electromagnetic coil, comprised as described above in the eighth aspect of the invention, the inner coil diameter of the electromagnetic coil mentioned in the second aspect of the invention is not more than 100 micrometers. Due to this construction, a smaller, thinner shape is realized.

In the magneto impedance sensor element with electromagnetic coil, comprised as described above in the ninth aspect of the invention, the line spacing separation per turn of the electromagnetic coil mentioned in the third aspect of the invention is not more than 50 micrometers. Due to this construction, a high density electromagnetic coil is realized, thereby also realizing higher sensitivity.

THE PREFERRED EMBODIMENT OF THE PRESENT INVENTION

The preferred embodiment of the present invention will be explained below with figures.

The First Embodiment

Figure 1:
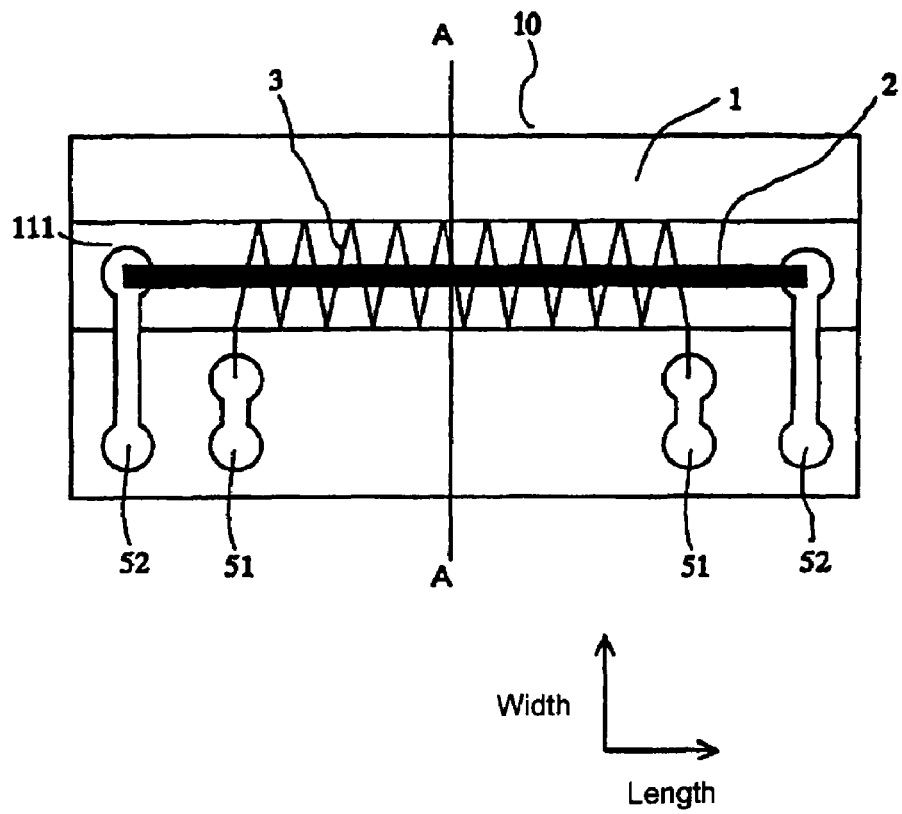
FIG. 1 shows a frontal view of the first embodiment and first example of the MI element of the present invention.
Figure 2:
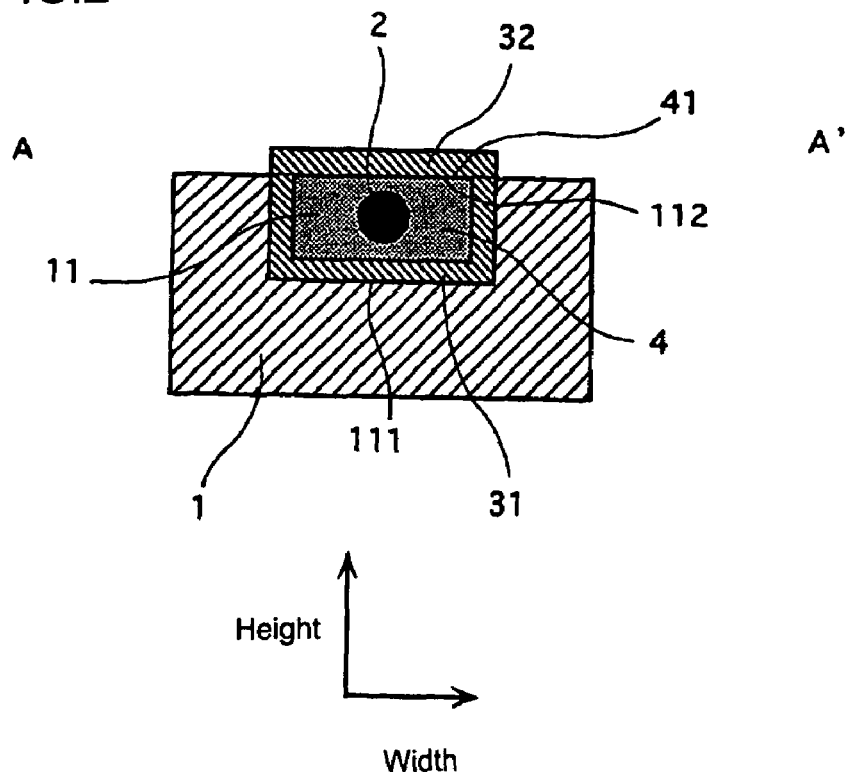
FIG. 2 shows a cross-sectional view of the first embodiment and first example of the MI element shown in FIG. 1, taken along line A–A' in FIG. 1.

The first embodiment of the present invention (magneto impedance sensor element with electromagnetic coil) is as the MI element is shown in FIG. 1 and FIG. 2. Magnetic sensitive body 2 is provided on terminal board 1, and will detect magnetic fields. Between magnetic sensitive body 2 and electromagnetic coil 3, there is no separate circuit board on which the magnetic sensitive body 2 will be set. By setting up the electromagnetic coil 3 with only insulation surrounding the magnetic sensitive body 2, the electromagnetic coil 3 is arranged with a diameter less than 200 micrometers. The terminals of the magnetic sensitive body 2 and coil 3 are connected to electrodes 51 and 52 respectively on the terminal board 1. When either high frequency or pulse electrical current is applied to magnetic sensitive body 2, voltage is output in accordance with the intensity of the external magnetic field that is generated in the electromagnetic coil 3.

By setting up coil 3 with only insulation surrounding magnetic sensitive body 2, it is possible to make the diameter less than 200 micrometers, and thereby to attain miniaturization of the MI element as a whole.

In the MI element of the present embodiment, the conductive magnetic wire of said magnetic sensitive body 2 is a diameter of 1 to 150 micrometers, and said terminal board 1 contains groove 11 with a depth of 5 to 200 micrometers. In said electromagnetic coil 3, electromagnetic coil 3 side 31 is arranged along groove surface 111. Remaining side 32 of the electromagnetic coil, which has been set on the inferior surface of circuit board 12, has been set on the exterior of the groove. Side 31 of the groove surface coil and remaining side 32 of the groove exterior coil form a two layer structure.

The coil diameter of said magnetic sensitive body 2 can be made less than 200 micrometers, by employing conductive magnetic wire with a diameter of 1 to 150 micrometers.

Furthermore, when magnetic wire is employed in said magnetic sensitive body 2, the output voltage per roll of wire in electromagnetic coil 1 increases, because magnetic wire is exceedingly sensitive to magnetization. Accordingly, it is possible to decrease the amount of rolled wire, so the length of the MI element can be made shorter.

By employing a groove construction in which groove 11 has been formed on said terminal board 1, miniaturization is further possible by arranging electromagnetic coil 3 on terminal board 1. At the same time, external contact with electromagnetic coil 3 can be prevented, and a mechanically safe MI sensor can be realized.

Moreover, the said conductive magnetic metal wire in the MI element of the present embodiment is made from amorphous metal wire.

As for specifying the material properties of amorphous magnetic wire, the output voltage per roll of wire in electromagnetic coil 1 will increase when it is used because amorphous metal wire is exceedingly sensitive to magnetization. Accordingly, it is possible to decrease the amount of rolled wire, so the length of the MI element can be made shorter.

In the said MI element of the present embodiment, the line spacing separation per unit length of the said electromagnetic coil 3 is less than 100 micrometers.

When the line spacing separation per turn (per unit length) is made less, and the quantity of rolled line per turn (per unit length) is increased, the output voltage will increase. For practicality, 100 micrometers per roll is suitable. In cases where the same output voltage is sufficient, the length of the MI element can be shortened. Moreover, the size of the said terminal board 1 in the MI element of the present embodiment is width from 20 micrometers to less than 1 mm, thickness from 20 micrometers to less than 1 mm, and length from 200 micrometers to less than 4 mm.

Because the height and width of the equivalent circular diameter of electromagnetic coil 3 is up to 200 micrometers, terminal board 1 can be made the above mentioned size, and a drastic redection in size, thickness, and volume of the entire body can be realized.

The Second Embodiment

The second embodiment of the present invention is stated below.

Generally speaking, high sensitivity magnetic sensors have high sensitivity because the change in detection output per change in detection input is large, but because they immediately reach full scale up to magnetic field saturation, their detection range is narrow. One possible method to widen the range is to lessen the aspect ratio (proportion of wire length to wire diameter in the magnetic field detection element) and take advantage of a demagnetizing field.

Figure 13:
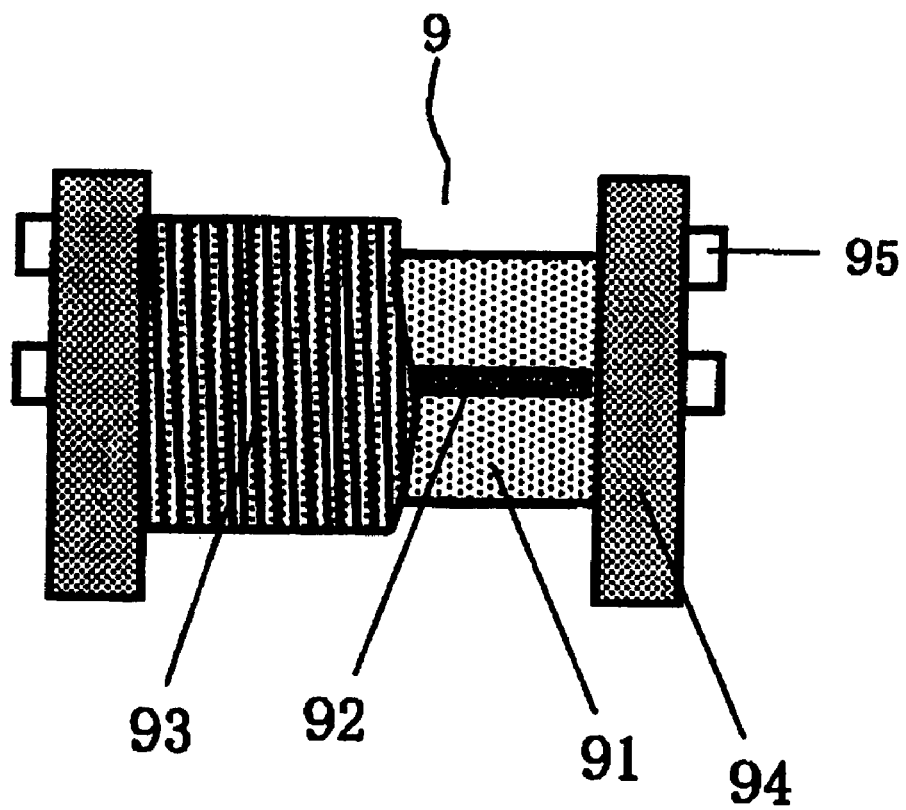
FIG. 13 shows a frontal view of a comparison example and conventional MI element.

However, the above-mentioned conventional magnetic sensor (MI, FG sensor), constructed as shown in FIG. 13, is limited in its miniaturization, and when miniaturized in order to have a high demagnetizing field, it suffers a severe deterioration of sensitivity.

Therefore, the second embodiment of the present invention is designed to provide a means to obtain an extremly small aspect ratio, which is the ratio of amorphous metal wire length to wire diameter, so that a large demagnetizing field is obtained without the loss of sensitivity. To maintain sensitivity, a microscopic high density coil is wrapped around that amorphous metal wire. Sensitivity is improved, the shape of the coil is small, and impedance L is extremely low. Therefore the oscillation that is evoked in the coil is increased, and by using an analog switch the magnetic field is detected without a loss in sensitivity.

In other words, from the perspective of widening sensor range, when the aspect ratio is set from 10 to 150 (for an amorphous metal wire diameter of 10 micrometers to 100 micrometers, an amorphous metal wire length of 100 micrometers to 10000 micrometers), the detection range will be 1.5 to 20 times that of conventional sensors, and when the aspect ratio is set from 10 to 100, the detection range will be 3 to 20 times that of conventional sensors. It is advantageous to set an aspect ratio of 10 to 50, which results in a detection range 5 to 20 times that of conventional sensors.

From the perspective of sensitivity, for an amorphous metal wire diameter of 10 micrometers to 100 micrometers, it is advantageous to establish an electromagnetic coil diameter of 10.05 micrometers to 1000 micrometers, from 1.005 to 10 times the amorphous metal wire diameter.

By using an analog switch as a detection method, it is possible to detect the magnetic field signal without impairing sensitivity.

The example embodiments will be explained below with figures.

Example Embodiment 1

Example 1 of the magneto impedance sensor element with electromagnetic coil is illustrated in FIG. 1 and FIG. 2.

The size of circuit board 1 is width 0.5 mm, height 0.5 mm, length 1.5 mm. The magnetic sensitive body is amorphous metal wire 2, using a CoFeSiB alloy of diameter 20 micrometers or 30 micrometers. Groove l ion the circuit board is depth 50 micrometers, width 70 micrometers, and length 1.5 mm. Electromagnetic coil 3 has a two layer structure comprised of coil side 31, formed on groove surface 111, and remaining side coil 32 formed on groove exterior 112 (exterior 41 of resin 4).

Figure 3:
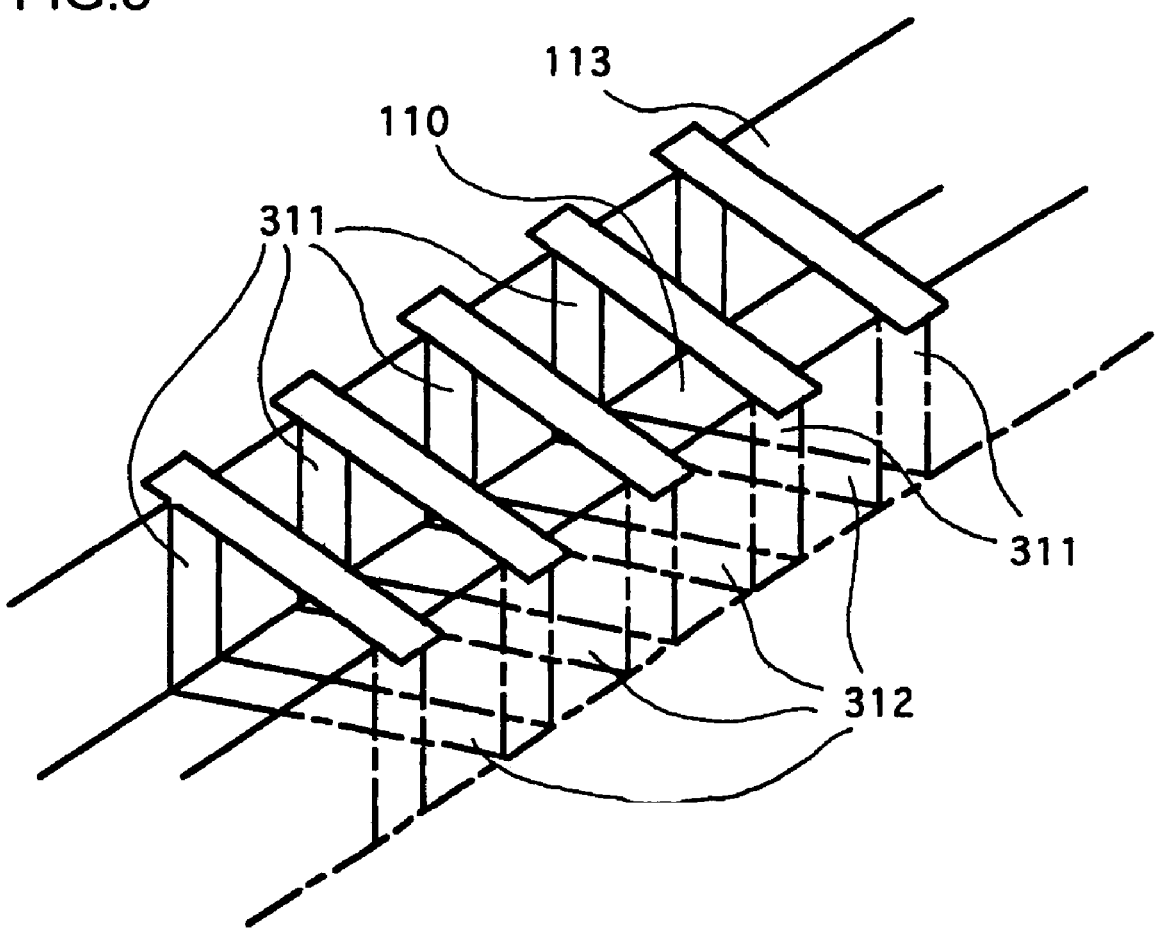
FIG. 3 is a sectional strabismus view of the arrangement of the coil inside the groove in the first embodiment and first example.
Figure 4:
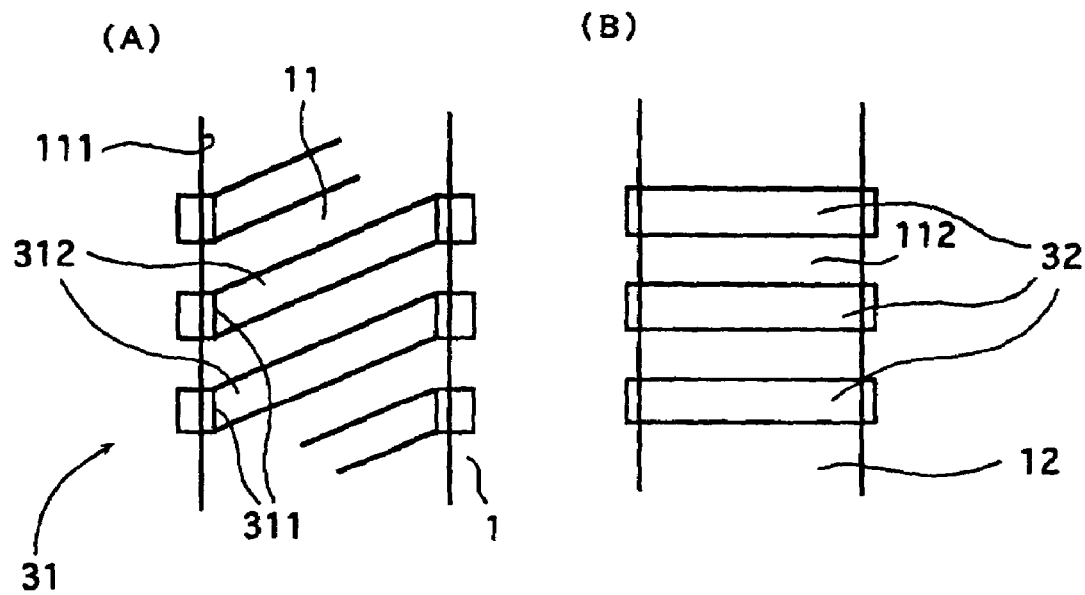
FIG. 4 is a sectional plane view of the arrangement of the coil inside the groove in the first embodiment and first example.
Figure 5:
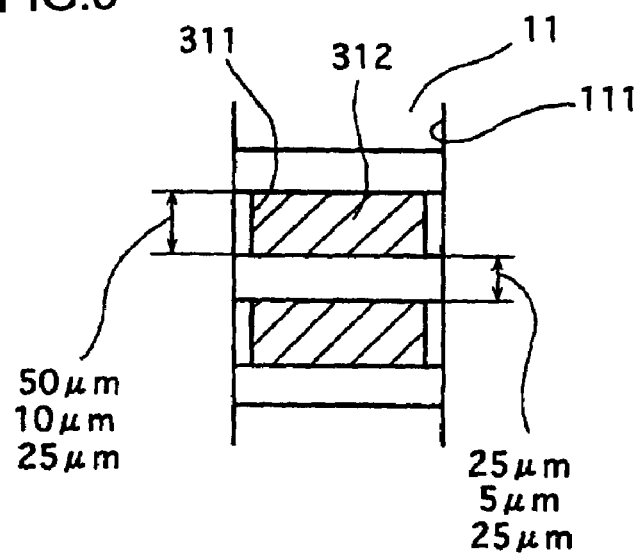
FIG. 5 is a sectional plan view of the arrangement of the coil inside the groove in the first embodiment and first example.

Coil side 31, formed on said groove surface 111, is comprised as shown in FIG. 3 through FIG. 5 and described below. Along the entire surface of groove surface 111 of groove 11, which is formed lengthwise on terminal board 1, and the adjoining part of said groove 11 on the surface of terminal board 1, a coil is formed of conductive thin metal film, which is deposited on that surface by means of vacuum evaporation. The gap sections of conductive thin metal film are removed by select etching method, in such a way that the formed thin metal film remains in a spiral shape.

i.e., on lateral/vertical face 113 of the said groove 11, coil part 311 is extended vertically. In the bottom of groove surface 110 of said groove 11, coil part 312 is extended diagonally so that it connects one vertical coil part on the lateral face of the groove to the adjoining coil part on the opposite lateral face of the groove.

Coil 32 of the remaining side is organized on said groove surface 112 (surface 41 of resin 4), as follows. Located crosswise in groove 11, which is formed lengthwise on said groove surface 112 (surface 41 of resin 4) of terminal board 1, it is constructed of strips of conductive thin metal film, which create a coil spanning a wider range, and deposited on the surface by means of vacuum evaporation. Such that a gap of standardized pitch is formed, parts of the conductive thin metal film are removed by select etching method. This is done so-that the metal film strips, longer than the width of the groove, remain extended in an oblong rectangular shape across the groove. It is acceptable to overcoat the surface of the above mentioned coil as necessary.

The inner coil diameter of electromagnetic coil 3 has a corresponding round diameter (round diameter having the same area as a groove cross-section which is formed of height and width) of 66 micrometers. The line spacing separation per turn (per unit length) of electromagnetic coil 3 is less than 50 micrometers.

Between amorphous metal wire 2 and electromagnetic coil 3, insulating resin 4 is arranged, which holds insulation for the conductive magnetic wire and electromagnetic coil. With respect to electrodes 5, four electrodes (terminal 51 of the electromagnetic coil and terminal 52 of the magnetic sensitive body) are placed on the face of the circuit board. To those electrodes 5, both ends of the previous amorphous metal wire 2 and both ends of electromagnetic coil 3 are connected. MI element 10 of the present invention is organized as mentioned above. Also note that the entire size of the present MI element is the same as the size of the terminal board.

Figure 6:
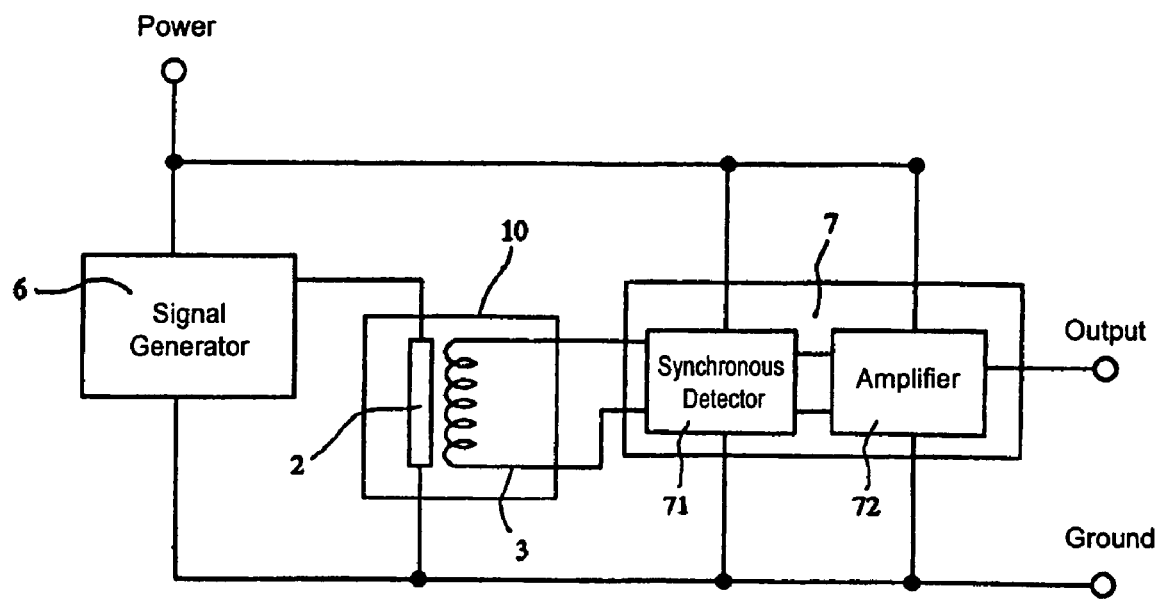
FIG. 6 is a block schematic which shows the electronic circuit of the MI sensor in the first embodiment and first example.

Next, the MI sensor shown in FIG. 6 is used to evaluate the characteristics of MI element 10. The electronic circuit used in the evaluation consists of signal generator 6, said MI element 10 and signal processor 7. The signal is a 170 mA pulse signal equivalent to 200 MHz, and the signal interval is 1 microsecond. The pulse signal is input to amorphous metal wire 2, and during the input time, voltage proportionate to the external magnetic field is transmitted to electromagnetic coil 3.

In signal processor 7, the voltage transmitted to electromagnetic coil 3 is extracted through opening and closing synchronous detector 71, which is linked to pulse signal input, and amplified to the prescribed voltage in amplifier 72.

Figure 7:
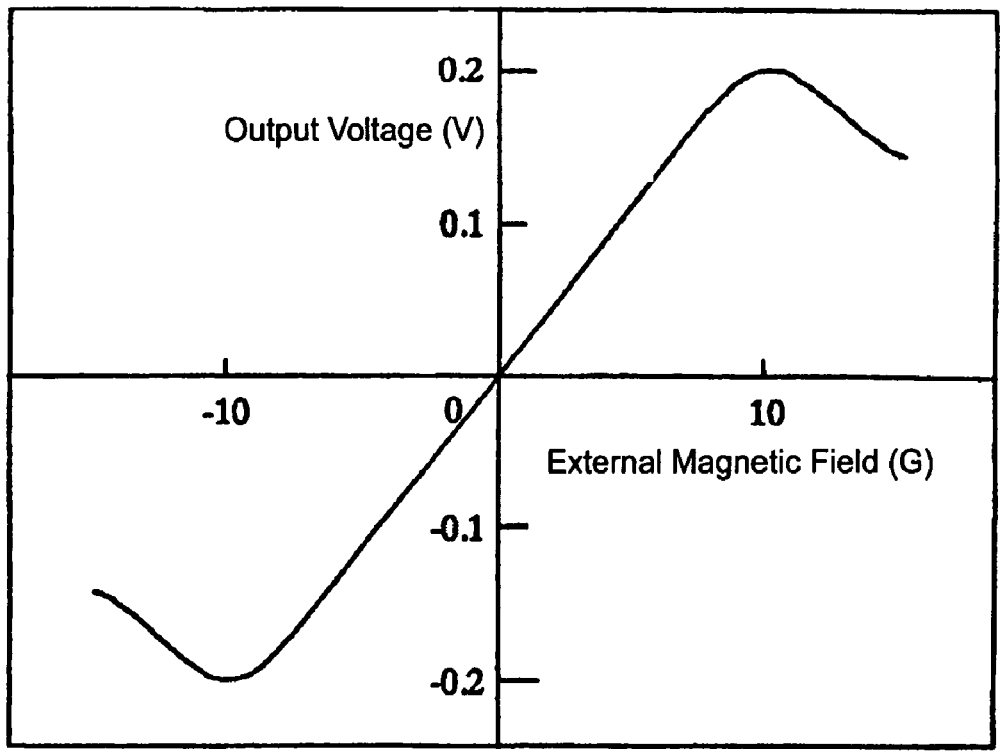
FIG. 7 is a graph showing the relationship between sensor output and the external magnetic field in the MI sensor using the MI element in the first embodiment and first example.

The sensor output from the above circuit is shown in FIG. 7.

In FIG. 7, the horizontal axis shows the intensity of the external magnetic field, and the vertical axis shows the sensor voltage output. Within an interval of sensor output ±10 G the graph shows exceptionally high linearity and sensitivity is 20 mV/G.

This is a level that can be satisfactorily used in a high sensitivity magnetic sensor.

Meanwhile, the measurements of conventional MI element 9, shown in comparison FIG. 13, are as follows. The size of circuit board 91, on which the amorphous metal wire is set, is width 0.7 mm, height 0.5 mm, length 3.5 mm. The magnetic sensitive body is amorphous metal wire 92, which uses a CoFeSiB alloy and has a wire diameter of 30 micrometers. Between amorphous metal wire 92 and electromagnetic coil 93 is coil frame 94, which serves as a bobbin for the coil, and provides insulation for the electromagnetic coil and conductive magnetic amorphous metal wire.

The core section of coil frame 94, which is resin molded, has width 1 mm, height 1 mm and length 3 mm. Electromagnetic coil 93 has an internal diameter of 1.5 mm. The four electrodes 95 for the magnetic sensitive body and the coil are set on coil frame 94. To electrodes 95, both ends of the previously mentioned amorphous metal wire 92 and both ends of electromagnetic coil 93 are connected. Conventional MI element 9 is organized as described above. The measurements of MI element 9 in this case are width 3 mm, height 2 mm, and length 4 mm. As noted earlier, the conventional element is quite large, and can not be applied in sensors whose set-up space is limited.

Accordingly, the present invention is extremely small and thin, and therefore applicable to ultra-small magnetic sensors used in small electronic machinery and tools, such as the sensors in wristwatches and mobile telephones.

Example 1 of the present invention is comprised as described below. On groove face 111 of slot 11, which is formed lengthwise on terminal board 1, and bottom face 112 of upper circuit board 12, a coil is formed of conductive thin metal film, deposited on the surface by means of vacuum evaporation. The unnecessary parts of conductive thin metal film are removed by select etching method, in such a way that the formed thin metal film remains in a spiral shape, forming an electromagnetic coil. As a result, the manufacture of a small and thin, high density MI sensor is made possible.

The result of using MI element 10 of Example 1, as shown in FIG. 3 through FIG. 5, is that despite incomparable miniaturization of about 1/50 (1/48) the size of a conventional MI element, MI element 10 is able to obtain outstanding linearity with a magnetic field area of ±10 G.

Shown in FIG. 13 as a comparison example area conventional bobbin-type sensor (wire length 2.5 mm, coil length 2 mm, 40 turns) and the sensor of Example 1 (wire diameter 20 micrometers and length 1.5 mm, coil length 1 mm, 18 turns). The result of comparing the range of the two sensors is shown in FIG. 8, where the horizontal axis is the external magnetic field and the vertical axis is the output voltage.

Figure 8:
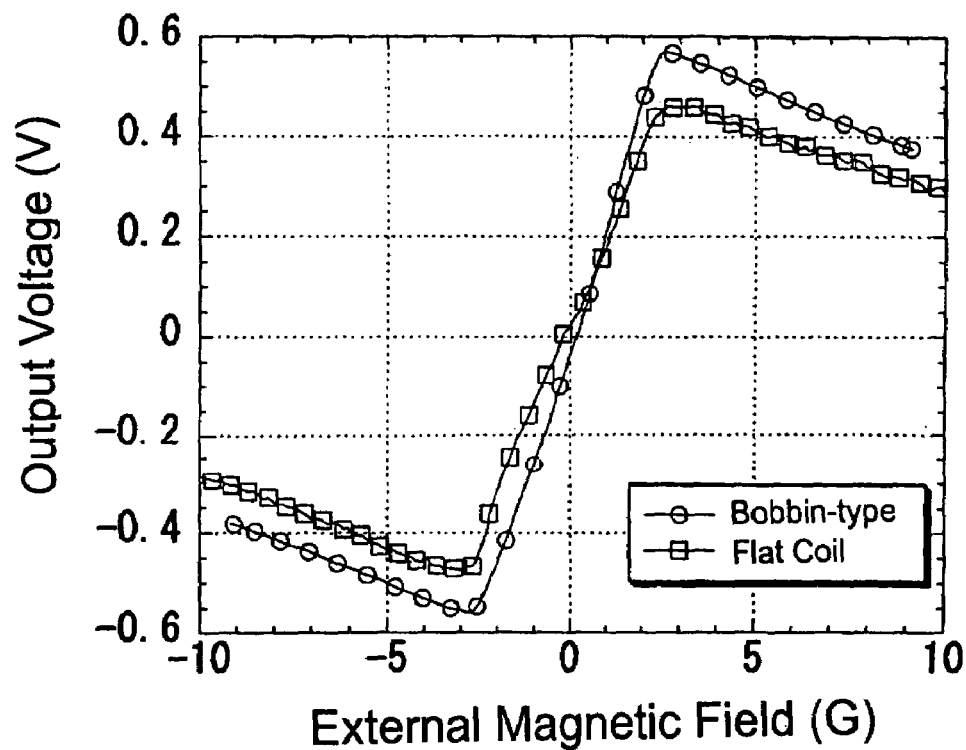
FIG. 8 is a graph showing the relationship between voltage output and the external magnetic field in conventional bobbin-type sensors and the sensor of the first example.

As is clear from FIG. 8, the ranges of a conventional bobbin-type sensor and the above-stated Example 1 sensor are roughly equal at about ±3 G. The output voltage of the Example 1 sensor is just over 80% that of a conventional bobbin-type sensor, but the fall in output voltage is comparatively low considering the degree of miniaturization. The voltage per turn of a bobbin-type sensor is 28 mV, while the voltage per turn in the Example 1 sensor is 53 mV. With about twice the voltage per turn of a bobbin-type sensor, the voltage per turn of the Example 1 sensor is well-suited for miniaturization.

Example Embodiment 2

Example 2 realizes a wide range, explained below in FIG. 1 through FIG. 5. The automotive industry is one concrete example of possible application.

Terminal board 1 is 0.67 mm long, and magnetic sensitive body 2 is made from amorphous metal wire 2, which uses a CoFeSiB alloy and has a diameter of 30 micrometers.

Electromagnetic coil 3 is made from side coil 31, which is formed on groove surface 111, and remaining side coil 32, which is formed on groove surface 112 (resin 4 exterior 41). The length of the entire body is 0.67 mm.

In Example 2, the amorphous metal wire used as magnetic sensitive body 2 has a diameter set at 30 micrometers, and the inner coil diameter of electromagnetic coil 3 has been set at 80 micrometers.

As listed in FIG. 3 and FIG. 5 and shown in chart 1, the lengthwise width of said groove 11 in coil parts 311 and 312 is set at 50 micrometers, 10 micrometers, and 25 micrometers. The gap is respectively set at 25 micrometers, 5 micrometers, and 25 micrometers.

In electromagnetic coil 3 generally, the ratio of the inner coil diameter to the diameter of amorphous metal wire is set within a range of 1.005 to 10. The amorphous metal wire diameter is set within a range of 10 micrometers to 100 micrometers, so when the amorphous metal wire diameter is 10 micrometers, the inner coil diameter of electromagnetic coil 3 should be set within a range of 10.05 micrometers to 100 micrometers. When the amorphous metal wire diameter is 100 micrometers, the inner coil diameter of electromagnetic coil 3 should be set within a range of 100.5 micrometers to 1000 micrometers.

In this example, the diameter of amorphous metal wire is 10 micrometers, and the inner coil diameter of electromagnetic coil 3 is 11 micrometers to 70 micrometers (1.1 to 7 times the wire diameter). When the diameter of amorphous metal wire is 100 micrometers, the inner coil diameter of electromagnetic coil 3 is 200 micrometers to 300 micrometers (2 to 3 times the wire diameter).

For an amorphous metal wire diameter of 100, the amorphous metal wire length is set at 100 micrometers to 10000 micrometers, establishing an aspect ratio from 10 to 100. Doing so, the detection range becomes 3 to 20 times that of a conventional sensor. It is therefore applicable in the automotive field, where wide range is required.

Figure 9:
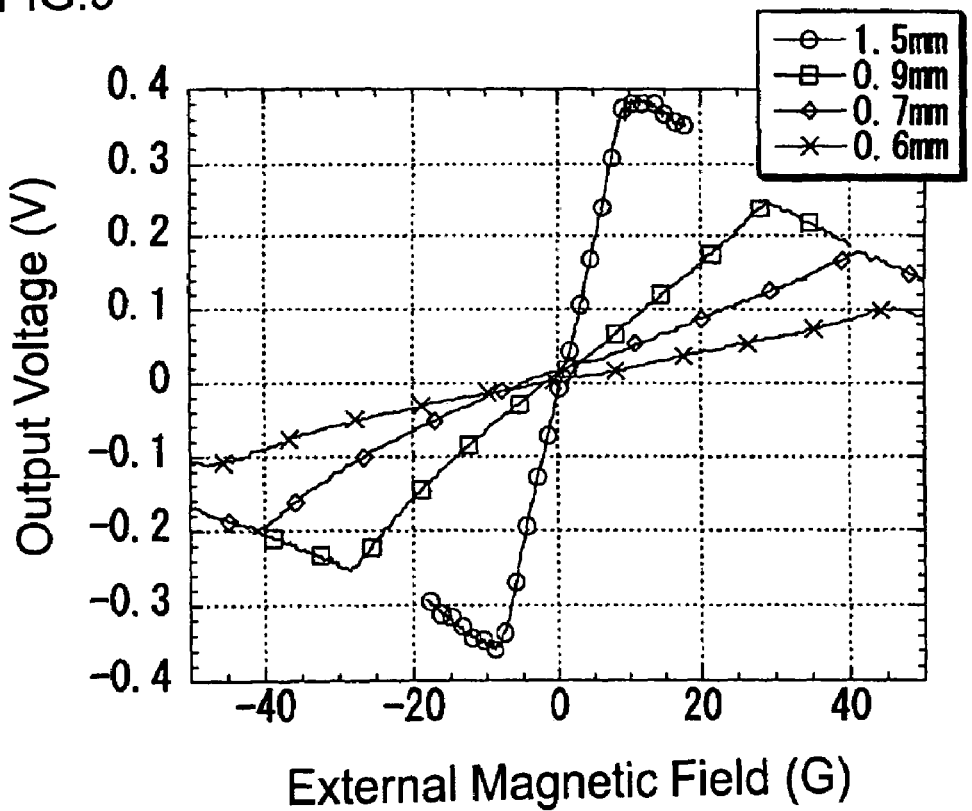
FIG. 9 is a graph showing the relationship between voltage output and the external magnetic field for the purpose of comparing the measuring range of amorphous metal wire of each length which is used as a magnetic sensitive body in the MI element of the second example of the present invention.

Also, four different lengths of the amorphous metal wire used as magnetic sensitive body 2 were prepared at 0.6 mm, 0.7 mm, 0.9 mm, and 1.5 mm. Example 1 shown in FIG. 7 was driven by high driving voltage, and the resulting range of each respective length of amorphous metal wire is shown in FIG. 9. The horizontal axis in FIG. 9 is the external magnetic field, and the vertical axis is the output voltage.

As clear from FIG. 9, the range for the shortest length (0.6 mm) of amorphous metal wire is extremely wide at ±45 G, and as the length of amorphous metal wire is increased, the range gets narrower. The range of a 0.6 mm wire length is about nine times as wide as the range of a 1.5 mm wire length.

Figure 10:
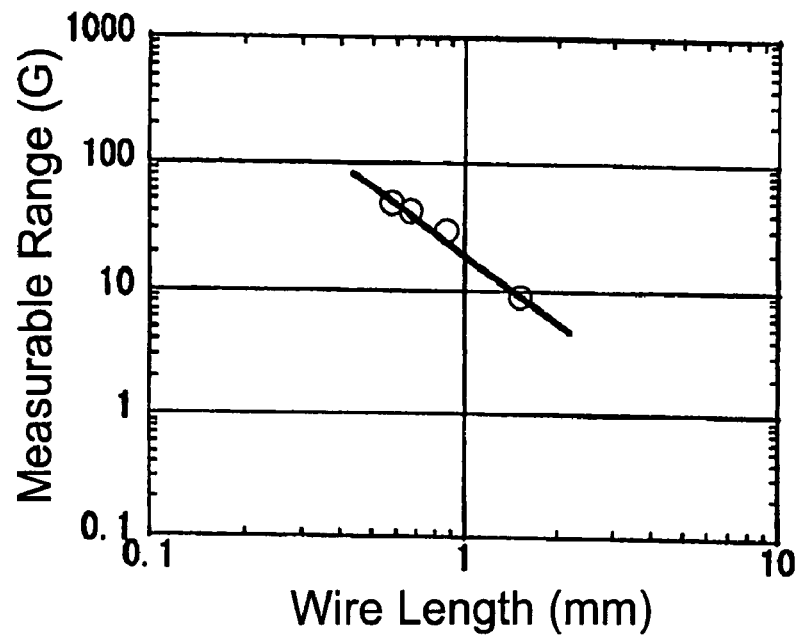
FIG. 10 is a graph showing the relationship between wire length (i.e., the aspect ratio) and the magnetic saturation field in each length of amorphous metal wire used as a magnetic sensitive body in the MI element of the second example of the present invention.

In FIG. 10, the magnetic field saturation, which determines the measurable range, is shown for the four different lengths of the amorphous metal wire used as magnetic sensitive body 2 which were prepared at 0.6 mm, 0.7 mm, 0.9 mm, and 1.5 mm, each having a wire diameter of 30 micrometers. The horizontal axis is the full wire length (i.e. aspect ratio), and the vertical axis is the measurable range (magnetic field saturation (G)). As is clear from FIG. 10, for the four different lengths of amorphous metal wire 0.6 mm, 0.7 mm, 0.9 mm, and 1.5 mm, magnetic field saturation (G) is linearly related to the wire length (i.e. aspect ratio).

When the amorphous metal wire has a diameter of 20 micrometers, electromagnetic coil 3 has an inner coil diameter of 80 micrometers, and amorphous metal wire length is 0.7 mm, a wide range of ±40 G is realized.

The above-stated range has also been confirmed for an amorphous metal wire length of 0.4 mm, and at that length the measurable scope of wide range is even greater than that of a 0.6 mm wire length.

In the magneto impedance sensor element with electromagnetic coil of Example 2, detection range can be widened without suffering a loss in sensor sensitivity. As stated above, space resolution in magnetic field measurement increases due to the small size of the element shape. Short sensor length is also advantageous for the improvement of frequency response.

Other embodiments are within the following claims.

While particular embodiments of the present invention have been shown and described, it will be obvious to those skilled in the art that, based on the teachings herein, changes and modifications may be made without departing from this invention and its broader aspects and therefore, the appended claims are to encompass within their scope all such changes and modifications as are within the true spirit and scope of this invention. Furthermore, it is to be understood that the invention is solely defined by the appended claims.

Figure 11:
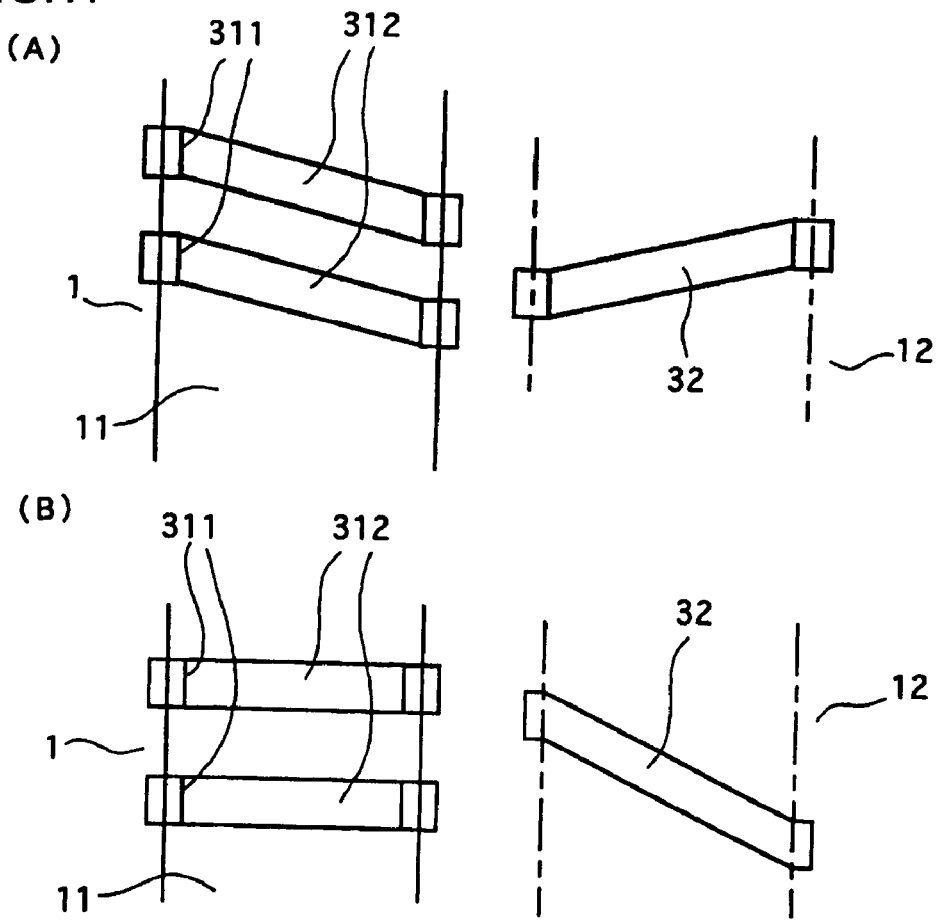
FIG. 11 is a plane view showing the arrangement of each part of the coil in the groove of another embodiment and example of the present invention.

By way of representative illustration, Example 1 can be comprised as follows. In groove base 110 of groove 11, coil part 312 is extended, in such away that it slopes diagonally to continue in series to the opposite up-down coil part. On inferior face 112 of upper circuit board 12, at a right angle to groove 11 which is formed lengthwise on said terminal board 1, coil part 32 is formed in a crosswise direction on said terminal board 1. This explanation is given by way of example, but the present invention is not limited to the above description. Other examples can also be employed: As shown in FIG. 11(A), slant and extend coil part 312, and also slant and extend coil part 32. Or, as shown in FIG. 11(B), form coil part 312 crosswise, perpendicular to groove 11, which is formed lengthwise on said terminal board 1.

Figure 12:
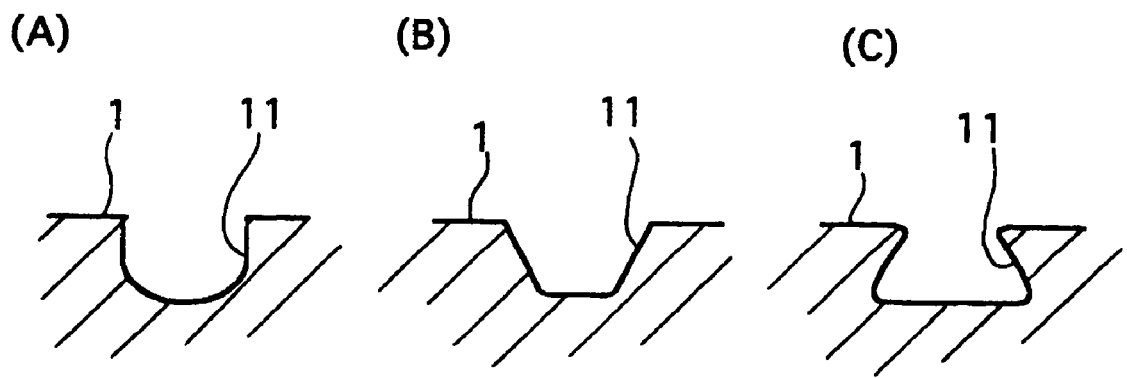
FIG. 12 is a cross-sectional view of an example groove shape on another embodiment and example of the present invention.

Also, as for the groove construction in above Example 1, rectangular groove 11 is formed on said terminal board 1 as shown in FIG. 2. This explanation of the groove construction is given by way of example, but the present invention is not limited to the above description. There are other ways the embodiment might be implemented, as shown in FIGS. 12(A) through (C), in which groove 11 is formed via etching removal on said terminal board 1. A U-shape (A), trapezoid (B), or reverse trapezoid (C) are all acceptable shapes for the groove.

Also, by way of representative illustration, the coil in above Example 1 might be arranged on the surface of the interior wall of groove 11, which is formed on said terminal board 1. This explanation of the coil is given by way of example, but the present invention is not limited to the above description. It is suitable if, after conductive thin metal film is deposited on the component surface by means of evaporation, an electromagnetic coil is formed in a spiral shape via select etching. For instance, the following embodiment can also be adopted: Construct an electromagnetic coil of conductive thin metal film deposited on the entire surface of the external wall of a linear component by means of vacuum evaporation. The linear component is made from insulating material whose cross-sectional shape is round, rectangular or polygonal. Such that a gap of prescribed pitch is formed while turning the said linear component at a prescribed speed, thin metal film is removed from the external wall by selective etching technique, forming a spiral-shaped electromagnetic coil. Later, insert amorphous metal wire that is cut to a prescribed length. The whole forms a complete MI element.

INDUSTRIAL FIELD OF APPLICATION

As written above, the present invention is extremely small and highly sensitive. It can therefore be applied to ultra-small magnetic sensors used in small electronic machinery and tools, such as the sensors in wristwatches and mobile telephones. Because it has realized a small size and wide range, it is also applicable in the automotive field.

What is claimed is:

1. A magneto impedance sensor element with electromagnetic coil comprised of:
    a terminal board on which an extended groove extending in one direction has been formed;
    an electromagnetic coil, made with one part of the coil formed spirally inside said extended groove on said terminal board, and joined to each tip of that part the other part of the coil placed across the top of the groove so that together the two parts form a complete spiral;
    insulating material placed in the extended groove on said terminal board; and
    a magnetic sensitive body inserted within said insulating material, to which either high frequency or pulse electric current is applied,
    wherein, when either high frequency or pulse electrical current is applied to said magnetic sensitive body, voltage is output from said electromagnetic coil in response to the intensity of the external magnetic field generated in said electromagnetic coil.

2. The magneto impedance sensor element with electromagnetic coil as recited in claim 1, wherein said magnetic sensitive body is made of conductive magnetic amorphous metal wire.

3. The magneto impedance sensor element with electromagnetic coil as recited in claim 2, wherein the length of said magnetic sensitive body has been set at less than 3 mm.

4. The magneto impedance sensor element with electromagnetic coil as recited in claim 2, wherein a ratio of wire diameter to wire length used in said magnetic sensitive body has been set at an aspect ratio from 10 to 100.

5. The magneto impedance sensor element with electromagnetic coil as recited in claim 4, wherein the inner coil diameter of said electromagnetic coil has been set from 1.005 to 10 times the wire diameter of said magnetic sensitive body.

6. The magneto impedance sensor element with electromagnetic coil as recited in claim 2, wherein the inner coil diameter of said electromagnetic coil is less than 100 micrometers.

7. The magneto impedance sensor element with electromagnetic coil as recited in claim 2, wherein the inner coil diameter of said electromagnetic coil is less than 200 micrometers.

8. The magneto impedance sensor element with electromagnetic coil as recited in claim 7, wherein said electromagnetic coil has a line spacing separation per turn of less than 100 micrometers.

9. The magneto impedance sensor element with electromagnetic coil as recited in claim 7, wherein a line spacing separation per turn of said electromagnetic coil is less than 50 micrometers.

* * * * *